(12) United States Patent
McCollum

(10) Patent No.: US 6,356,478 B1
(45) Date of Patent: Mar. 12, 2002

(54) FLASH BASED CONTROL FOR FIELD PROGRAMMABLE GATE ARRAY

(75) Inventor: John McCollum, Saratoga, CA (US)

(73) Assignee: Actel Corporation, Sunnyvale, CA (US)

( * ) Notice: Subject to any disclaimer, the term of this patent is extended or adjusted under 35 U.S.C. 154(b) by 0 days.

(21) Appl. No.: 09/748,648

(22) Filed: Dec. 21, 2000

(51) Int. Cl.$^7$ .............................. G11C 16/04
(52) U.S. Cl. ..................... 365/185.01; 365/185.05; 365/185.1; 365/185.18
(58) Field of Search ................ 326/39, 41; 365/185.01, 365/185.1, 185.05, 185.18

(56) References Cited

U.S. PATENT DOCUMENTS 5,587,603 A * 12/1996 Kowshik ................ 257/316
5,740,106 A * 4/1998 Nazarian ................ 365/185.1
6,005,806 A * 12/1999 Madurawe et al. .... 365/185.23
6,144,580 A * 11/2000 Murray ................ 365/185.01

* cited by examiner

*Primary Examiner*—Son Mai
(74) *Attorney, Agent, or Firm*—Sierra Patent Group, Ltd.

(57) ABSTRACT

A circuit for controlling a switching transistor in a reprogrammable FPGA device comprises first and second floating gate flash memory transistors. A first floating gate flash memory transistor has a drain electrically coupled to a first voltage potential, a floating gate, a control gate coupled to a control gate node, and a source coupled to an output node. A second floating gate flash memory transistor has a drain electrically coupled to the output node, a floating gate, a control gate coupled to the control gate node, and a source coupled to a second voltage potential. The output node is coupled to the gate of a switching transistor.

6 Claims, 2 Drawing Sheets

|  | PROGRAM SWITCH ON | PROGRAM SWITCH OFF | OPERATE |
|---|---|---|---|
| NODE 22 | GND | +5V | Vcc |
| NODE 26 | GND | +5V | GND |
| NODE 28 | +16V | -11V | GND |

|  | ERASE | PROGRAM SWITCH ON | PROGRAM SWITCH OFF | OPERATE |
|---|---|---|---|---|
| NODE 22 | GND | +5V | GND | Vcc |
| NODE 26 | GND | GND | +5V | GND |
| NODE 28 | +16V | -11V | -11V | +2V |

|  | PROGRAM SWITCH ON | PROGRAM SWITCH OFF | OPERATE |
|---|---|---|---|
| NODE 22 | GND | +5V | Vcc |
| NODE 26 | GND | +5V | GND |
| NODE 28 | +16V | -11V | GND |

FLASH BASED CONTROL FOR FIELD PROGRAMMABLE GATE ARRAY

BACKGROUND OF THE INVENTION

1. Field of the Invention

The present invention relates to field programmable gate array (FPGA) integrated circuits. More particularly, the present invention relates to reprogrammable FPGA devices and to flash memory devices for controlling a switching transistor in a reprogrammable FPGA device.

2. The Prior Art

FPGA integrated circuits are known in the art. FPGA devices may be classified in one of two categories. One category of FPGA devices is one-time programmable and uses elements such as antifuses for making programmable connections. The other category of FPGA devices is reprogrammable and uses transistor switches to make programmable connections.

Reprogrammable FPGA devices include some means for storing program information used to control the transistor switches. Non-volatile memory devices such as EPROMs EEPROMS, non-volatile RAM and flash memory devices have all been proposed for or used to store programming information in the class of reprogrammable FPGA applications.

BRIEF DESCRIPTION OF THE INVENTION

A first circuit for controlling a switching transistor in a reprogrammable FPGA device according to the present invention comprises first and second floating gate flash memory transistors. A first floating gate flash memory transistor has a drain electrically coupled to a first voltage potential, a floating gate, a control gate coupled to a control gate potential node, and a source coupled to an output node. A second floating gate flash memory transistor has a drain electrically coupled to the output node, a floating gate, a control gate coupled to the control gate potential node, and a source coupled to a second voltage potential. The output node is coupled to the gate of a switching transistor.

A second circuit for controlling a switching transistor in a reprogrammable FPGA device according to the present invention comprises first and second floating gate flash memory transistors having a common floating gate. A first floating gate flash memory transistor has a drain electrically coupled to a first voltage potential, a floating gate, a control gate coupled to a control gate potential node, and a source coupled to an output node. A second floating gate flash memory transistor has a drain electrically coupled to the output node, a floating gate, a control gate coupled to the control gate potential node, and a source coupled to a second voltage potential. The output node is coupled to the gate of a switching transistor.

The circuit is operated by first erasing the first and second floating gate flash memory transistors. To erase the first and second floating gate flash memory transistors, an erase potential is applied between the control gate potential node and both the drain of the first floating gate flash memory transistor and the source of the second floating gate flash memory transistor. After the first and second floating gate flash memory transistors have been erased, the first floating gate flash memory transistor is programmed if the switching transistor is to be turned on and the second floating gate flash memory transistor is programmed if the switching transistor is to be turned off. The first floating gate flash memory transistor is programmed by applying a programming potential between the control gate potential node and the drain of the first floating gate flash memory transistor. The second floating gate flash memory transistor is programmed by applying a programming potential between the control gate potential node and the source of the second floating gate flash memory transistor.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figures 1, 2:
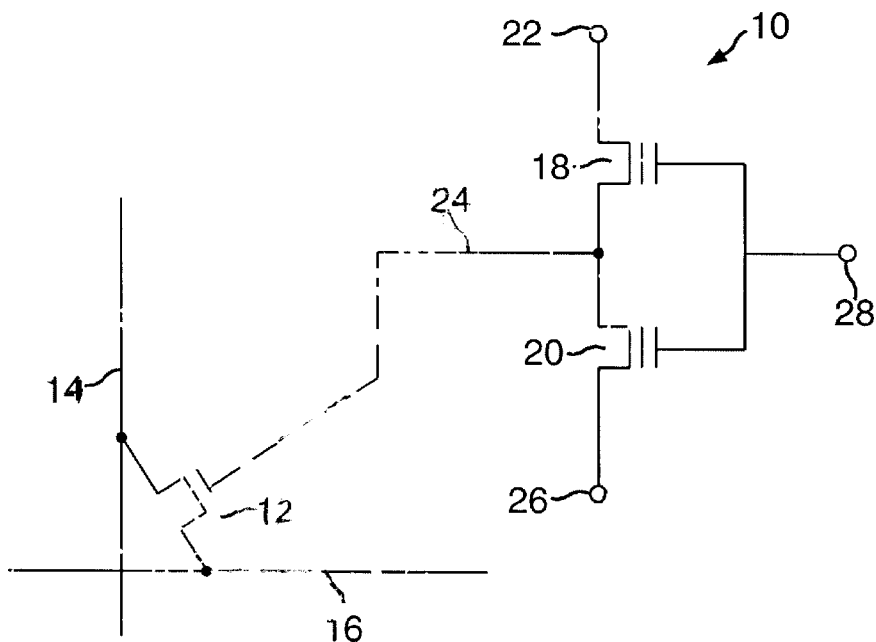
FIG. 1 is a schematic diagram of a switching transistor and control circuit according to a first embodiment of the present invention.
FIG. 2 is a chart showing representative potentials that may be applied to the circuit of FIG. 1 for the purposes of erasing, programming, and operating the circuit.

Referring first to FIG. 1, a schematic diagram shows a control circuit 10 for driving a switching transistor 12 according to a first embodiment of the present invention. Switching transistor 12 may be turned on to selectively connect vertical interconnect wiring segment 14 to horizontal interconnect wiring segment 16 in the integrated circuit. While FIG. 1 shows switching transistor 12 used to programmably connect vertical and horizontal interconnect wiring segments 14 and 16, persons of ordinary skill in the art will readily understand that FIG. 1 presents only an illustrative example and that switching transistor 12 can be employed for any programmable function encountered in FPGA integrated circuits.

Control circuit 10 includes a first floating gate flash memory transistor 18 and second floating gate flash memory transistor 20. Persons of ordinary skill in the art will understand that the particular design of first and second floating gate flash memory transistors 18 and 20 is not critical to the present invention and therefore that any one of numerous available floating gate flash memory transistors may be employed for use as first and second floating gate flash memory transistors 18 and 20.

First floating gate flash memory transistor 18 has its drain electrically coupled to a first voltage potential node 22, and its source electrically coupled to an output node 24 to which the control gate of switching transistor 12 is electrically coupled. Second floating gate flash memory transistor 20 has its drain electrically coupled to the output node 24 and its source a first voltage potential node 22, and its source electrically coupled to a second voltage potential node 26. The control gates of both first and second floating gate flash memory transistors 18 and 20 are electrically coupled to a control gate node 28. As will be appreciated by persons of ordinary skill in the art, the control gates of both first and second floating gate flash memory transistors 18 and 20 can be formed from a single piece of polysilicon.

Control circuit 10 is operated by first erasing both first and second floating gate flash memory transistors 18 and 20 and then programming one of them depending on whether it is desired that switching transistor 12 be on or off. Erasing and programming is performed by applying appropriate potentials to nodes 22, 26, and 28. After programming, an operating mode for control circuit 10 is entered in which the first voltage potential node is placed at Vcc and the second potential node is placed at ground. Circuits for applying appropriate erase, programming, and operating potentials to floating gate flash memory transistors are well known in the flash memory art and are not shown herein to avoid over-complicating the disclosure and thus unnecessarily obscuring the invention.

In the example illustrated in FIG. 1, if it is desired to turn switching transistor 12 on to connect vertical interconnect conductor 14 to horizontal interconnect conductor 16, first floating gate flash memory transistor 18 is programmed and second floating gate flash memory transistor 20 is left erased. In such a case, output node 24 is pulled up to Vcc during the operating mode of control circuit 10 and switching transistor 12 is turned on. On the other hand, if it is desired to turn switching transistor 12 off to leave vertical interconnect conductor 14 and horizontal interconnect conductor 16 unconnected, second floating gate flash memory transistor 20 is programmed and first floating gate flash memory transistor 18 is left erased. In such a case, output node 24 is pulled down to ground during the operating mode of control circuit 10 and switching transistor 12 is turned off.

Referring now to FIG. 2, a chart shows representative potentials that may be applied to the circuit of FIG. 1 for the purposes of erasing, programming, and operating the circuit. First, to erase both first and second floating gate flash memory transistors 18 and 20, +16 volts is applied to the control gate node 28 and ground potential is applied to both first and second voltage potential nodes 22 and 26. Under these conditions, electrons are cause to tunnel onto the floating gate thereby shifting the thresholds of both first and second floating gate flash memory transistors 18 and 20 more negative. During the operating mode of the control circuit 10, positive voltage applied to the control gate node 28 will not be sufficient to turn on either transistor 18 or 20.

Next, either one of first and second floating gate flash memory transistors 18 and 20 is programmed depending on the desired state of switching transistor 12. If switching transistor 12 is to be turned on, first floating gate flash memory transistor 18 is programmed by applying +5 volts to first voltage potential node 22 and −11 volts to control gate node 28, while holding second voltage potential node 26 at ground. Under these conditions, electrons are cause to tunnel off of the floating gate of first floating gate flash memory transistor 18, thereby shifting the threshold of first floating gate flash memory transistor 18 more positive. Because second voltage potential node 26 is placed at ground, there is not sufficient potential to cause tunneling of electrons to the floating gate of second floating gate flash memory transistor 20, which remains in its erased state. During the operating mode of the control circuit 10, positive voltage applied to the control gate node 28 will be sufficient to turn on first floating gate flash memory transistor 18 but will not be sufficient to turn on second floating gate flash memory transistor 20.

If switching transistor 12 is to be turned off first second floating gate flash memory transistor 20 is programmed by applying +5 volts to second voltage potential node 26 and −11 volts to control gate node 28, while holding first voltage potential node 22 at ground. Under these conditions, electrons are cause to tunnel off of the floating gate of second floating gate flash memory transistor 20 thereby shifting the threshold of second floating gate flash memory transistor 20 more positive. Because first voltage potential node 22 is placed at ground, there is not sufficient potential to cause tunneling of electrons to the floating gate of first floating gate flash memory transistor 18, which remains in its erased state. During the operating mode of the control circuit 10, positive voltage applied to the control gate node 28 will be sufficient to turn on second floating gate flash memory transistor 20 but will not be sufficient to turn on first floating gate flash memory transistor 18.

As may be seen from an examination of FIG. 2, first voltage potential node 22 is placed at Vcc, second voltage potential node 26 is placed at ground, and control gate node 28 is placed at about 2 volts during the operating mode of control circuit 10. The voltage at control gate node 28 is sufficient to turn on which ever one of first and second floating gate flash memory transistor 18 and 20 that has been programmed, thus appropriately pulling up or pulling down the gate of switching transistor 12 to turn it on or off.

Figures 3, 4:
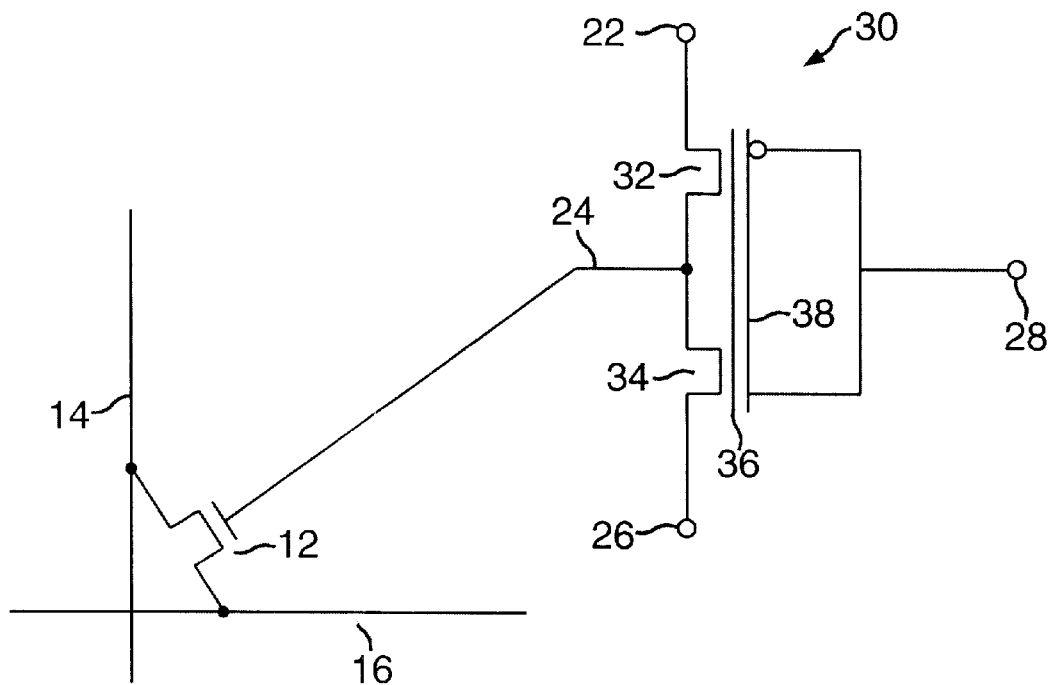
FIG. 3 is a schematic diagram of a switching transistor and control circuit according to a second embodiment of the present invention.
FIG. 4 is a chart showing representative potentials that may be applied to the circuit of FIG. 3 for the purposes of erasing, programming, and operating the circuit.

Referring now to FIG. 3, a schematic diagram shows a control circuit 30 for driving a switching transistor 12 according to a second embodiment of the present invention. Because the control circuit 30 of FIG. 3 is in many respects similar to the control circuit 10 of FIG. 1, elements of the control circuit 30 depicted in FIG.3 that correspond to like elements in circuit 10 of FIG. 1 will be referred to by the same reference numerals used in FIG. 1.

As in the control circuit of FIG. 1, switching transistor 12 in FIG. 3 may be turned on to selectively connect vertical interconnect wiring segment 14 to horizontal interconnect wiring segment 16 in the integrated circuit.

Control circuit 30 includes a p-channel floating gate flash memory transistor 32 and an n-channel floating gate flash memory transistor 34. Persons of ordinary skill in the art will understand that the particular design of p-channel and n-channel floating gate flash memory transistors 32 and 34 is not critical to the present invention and therefore that any one of numerous available floating gate flash memory transistors may be employed for use as p-channel and n-channel floating gate flash memory transistors 32 and 34.

P-channel floating gate flash memory transistor 32 has its drain electrically coupled to a first voltage potential node 22, and its source electrically coupled to an output node 24 to which the control gate of switching transistor 12 is electrically coupled. N-channel floating gate flash memory transistor 34 has its drain electrically coupled to the output node 24 and its source a first voltage potential node 22, and its source electrically coupled to a second voltage potential node 26. The floating gates of both p-channel floating gate flash memory transistor 32 and n-channel floating gate flash memory transistor 34 are electrically coupled together, are shown in FIG. 3 as a single gate 36, and can be formed from a single piece of polysilicon. The control gates of both p-channel and n-channel floating gate flash memory transistors 32 and 34 are electrically coupled to a control gate node 28 and are shown in FIG. 3 as a single gate 38. As will be appreciated by persons of ordinary skill in the art, the control gates of both first and second floating gate flash memory transistors 32 and 34 can be formed from a single piece of polysilicon.

As a consequence of its structure including a single floating gate 36 serving both p-channel floating gate flash memory transistor 32 and n-channel floating gate flash memory transistor 34, an erase step is not necessary and control circuit 30 of FIG. 3 may be operated after a single-step programming operation to turn on a desired one of p-channel and n-channel floating gate flash memory transistors 32 and 34 depending on whether it is desired that switching transistor 12 be on or off. Programming is performed by applying appropriate potentials to nodes 22, 26, and 28 to shift the thresholds of p-channel and n-channel floating gate flash memory transistors 32 and 34 such that one of them will turn on when a voltage is applied to the control gate node 28. After programming, an operating mode for control circuit 30 is entered in which the first voltage potential node is placed at Vcc and the second potential node is placed at ground. Circuits for applying the appropriate programming, and operating potentials to floating gate flash memory transistors are well known in the flash memory art.

If it is desired to use control circuit 30 to turn switching transistor 12 on to connect vertical interconnect conductor 14 to horizontal interconnect conductor 16, control circuit 30 is programmed to turn on p-channel floating gate flash memory transistor 32 and to turn off n-channel floating gate flash memory transistor 34. In such a case, output node 24 is pulled up to Vcc during the operating mode of control circuit 30 and switching transistor 12 is turned on. On the other hand, if it is desired to turn switching transistor 12 off to leave vertical interconnect conductor 14 and horizontal interconnect conductor 16 unconnected, control circuit 30 is programmed to turn on n-channel floating gate flash memory transistor 34 and to turn off p-channel floating gate flash memory transistor 32. In such a case, output node 24 is pulled down to ground during the operating mode of control circuit 30 and switching transistor 12 is turned off.

Referring now to FIG. 4, a chart shows representative potentials that may be applied to the circuit of FIG. 3 for the purposes of programming and operating the control circuit 30. If switching transistor 12 is to be turned on, control circuit 30 is programmed to turn on p-channel floating gate flash memory transistor 32 and to turn off n-channel floating gate flash memory transistor 34 by applying about zero volts (ground) to first and second voltage potential nodes 22 and 26, and about +16 volts to control gate node 28. Under these conditions, electrons are cause to tunnel on to the common floating gate 36, thereby shifting the threshold of both p-channel floating gate flash memory transistor 32 and n-channel floating gate flash memory transistor 34 more negative. During the operating mode of the control circuit 30, positive voltage applied to the control gate node 28 will be sufficient to turn on p-channel floating gate flash memory transistor 32 but will not be sufficient to turn on n-channel floating gate flash memory transistor 34 due to the negative threshold voltage shift caused by the electrons on floating gate 36.

If switching transistor 12 is to be turned off, control circuit 30 is programmed to turn off p-channel floating gate flash memory transistor 32 and to turn on n-channel floating gate flash memory transistor 34 by applying about +5 volts to first and second voltage potential nodes 22 and 26, and about −11 volts to control gate node 28. Alternatively, one of nodes 22 and 26 may be grounded while the other one is placed at about +5 volts. Under these conditions, electrons are cause to tunnel off of the common floating gate 36, thereby shifting the thresholds of p-channel floating gate flash memory transistor 32 and n-channel floating gate flash memory transistor 34 more positive. During the operating mode of the control circuit 30, gate voltage applied to the control gate node 28 will be sufficient to turn on n-channel floating gate flash memory transistor 34 but will not be sufficient to turn on p-channel floating gate flash memory transistor 32 due to the positive threshold voltage shift caused by the electrons on floating gate 36.

As may be seen from an examination of FIG. 4, first voltage potential node 22 is placed at Vcc, second voltage potential node 26 is placed at ground, and control gate node 28 is placed at about zero volts (ground) during the operating mode of control circuit 10. The voltage at control gate node 28 is sufficient to turn on which ever one of p-channel and n-channel floating gate flash memory transistor 32 and 34 that has been programmed, thus appropriately pulling up or pulling down the gate of switching transistor 12 to turn it on or off.

Persons of ordinary skill in the art will readily understand that the voltage levels disclosed herein for erase, program, and operating modes of the control circuits 10 and 30 of FIGS. 1 and 3 are merely illustrative examples. Such skilled persons will immediately recognize that the actual voltages to be applied to the control circuits 10 and 30 to perform these functions will depend on the geometry and scaling, as well as the fabrication process used to form the particular floating gate flash memory transistors utilized in any actual design.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A circuit for controlling a switching transistor comprising:
    a control gate potential node;
    an output node;
    a p-channel floating gate flash memory transistor having a drain electrically coupled to a first voltage potential, a floating gate, a control gate coupled to said control gate potential node, and a source coupled to said output node;
    an n-channel floating gate flash memory transistor having a drain electrically coupled to said output node, a floating gate, a control gate coupled to said control gate potential node, and a source coupled to a second voltage potential;
    wherein said floating gate of said p-channel floating gate flash memory transistor is electrically coupled to said floating gate of said n-channel floating gate memory transistor; and
    wherein said output node is coupled to said switching transistor.

2. A circuit for controlling a switching transistor comprising:
    a control gate potential node;
    an output node;
    a p-channel floating gate flash memory transistor having a drain electrically coupled to a first voltage potential, a floating gate, a control gate coupled to said control gate potential node, and a source coupled to said output node;
    an n-channel floating gate flash memory transistor having a drain electrically coupled to said output node, a floating gate, a control gate coupled to said control gate potential node, and a source coupled to a second voltage potential;
    wherein said floating gate of said p-channel floating gate flash memory transistor and said floating gate of said n-channel floating gate memory transistor are formed from a single contiguous piece of polysilicon; and wherein said output node is coupled to said switching transistor.

3. The circuit of claim 2 wherein:

said first and second voltage potentials are independently switchable between programming potentials and an operating potentials; and said control gate potential node is switchable between a programming potential and an operating potential.

4. A method for controlling a switching transistor comprising:

providing said switching transistor having a gate:

providing a first floating gate flash memory transistor having a drain electrically coupled to a first voltage potential, a floating gate, a control gate coupled to a control gate potential node, and a source coupled to an output node;

providing a second floating gate flash memory transmitter having drain electrically coupled to said output node, a floating gate, a control gate coupled to said control gate potential node, and a source coupled to a second voltage potential;

providing a single contiguous piece of polysilicon forming said floating gate of said first floating gate flash memory transistor and said floating gate of said second floating gate flash memory transistor;

coupling said output node to said switching transistor;

programming said floating gate to a first state if said switching transistor is to be turned on; and programming said floating gate to a second state if said switching transistor is to be turned off.

5. The method of claim 3 wherein:

programming said floating gate such that said first floating gate flash memory transistor is turned on if said switching transistor is to be turned on; and programming said floating gate such that said second floating gate flash memory transistor is on if said switching transistor is to be turned off.

6. The method of claim 3 wherein:

programming said first floating gate flash memory transistor and second gate flash memory transistor comprises applying a programming potential between said control gate potential node and the drain of said first floating gate memory transistor;

programming said second floating gate flash memory transistor comprises applying said programming potential between said control gate potential node and the source of said second gate flash memory transistor.

* * * * *